United States Patent

Bluzer et al.

[11] Patent Number: 5,532,485
[45] Date of Patent: Jul. 2, 1996

[54] MULTISPECTRAL SUPERCONDUCTIVE QUANTUM DETECTOR

[75] Inventors: Nathan Bluzer, Rockville, Md.; Martin G. Forrester, Pittsburgh, Pa.

[73] Assignee: Northrop Grumman Corp., Linthicum, Md.

[21] Appl. No.: 323,228

[22] Filed: Oct. 14, 1994

[51] Int. Cl.$^6$ .................................................. H01L 39/22
[52] U.S. Cl. ........................ 250/336.2; 505/848; 505/849
[58] Field of Search ..................... 250/336.2; 505/848, 505/849

[56] References Cited

U.S. PATENT DOCUMENTS 5,185,527  2/1993  Bluzer .................................. 250/336.2

FOREIGN PATENT DOCUMENTS 248870  8/1987  Germany .............................. 250/336.2

Primary Examiner—Carolyn E. Fields

[57] ABSTRACT

An array of superconductive quantum detectors (SQD) with current biased SQUID flowing in one direction from fifty percent of the detectors and flowing in the opposite direction for the other fifty percent. The SQD in one embodiment has a serpentine pattern loop and minimal cross-sectional area to increase kinetic induction. A directly connected SQUID is within the loop of one embodiment and exterior of the loop in another embodiment. Methods of optimizing the signal of the array and different types of Josephson Junctions are also disclosed.

34 Claims, 8 Drawing Sheets

MULTISPECTRAL SUPERCONDUCTIVE QUANTUM DETECTOR

BACKGROUND OF THE INVENTION

1. Field of the Invention

The present invention relates to radiant energy detectors; and more particularly, to a multispectral superconductive quantum detector array, individual superconductive quantum detectors for an array, and related methods.

2. Description of Related Art

Basically there are two general types of radiant energy detectors; namely, thermal detectors and quantum detectors. A thermal detector, which is sometimes referred to as a bolometer is in effect a very sensitive thermometer whose electrical resistance, for example, varies with temperature; and which is used in the detection and measurement of absorbed thermal radiation. A quantum detector changes its electronic characteristics without significant lattice heating in accordance with the radiant flux absorbed by the detector.

Photon sensors have significant applications in both commercial and military areas. For example, in commercial areas, photon sensors may be used for imaging, energy conservation by identifying thermal profiles of energy escape paths, mapping of agricultural and mineral resources from spectral signatures obtained from satellite images, identification of pollution emitted from industrial processes, detection of tumors in humans and defects in manufactured products from their temperature profiles, detection and measurement of the energy of ionizing radiation for medical applications, and nuclear non-proliferation treaty monitoring. Also, photon sensors may be used for night surveillance, reconnaissance, target identification, and guidance for missiles. However, the various individual applications for photon sensors involve different spectral bands, which are determined by performance advantages dictated by each particular application. Because of their broad spectral response, it is proposed to use an array of superconductive quantum detectors as a photosensor.

The feasibility of using an array of superconductive quantum detectors is determined by the size of the array; i.e., the number of individual superconductive quantum detectors, hereinafter referred to at times as (SQD), required for a particular application, the complexity of the array, and the difficulty and cost of manufacture.

Such an array is limited by the operational parameters of the individual SQD's and their associated read-out devices. A superconductive quantum interference device, referred to as SQUID can be used to read-out a SQD. For example, one of the important parameters that determines the magnitude and signal-to-noise ratio is the change in kinetic inductance developed in the detector loop by the radiant energy exposure. Another important operational parameter that determines the magnitude of the signal-to-noise ratio, is the coupling efficiency of the read-out SQUID to the SQD. Difficulty in implementing the array is determined by the process of fabricating the read-out SQUID and the SQD, and the numerous circuit connections which contribute to the complexity of the array.

In light of the foregoing, there is a need for an array of superconductive quantum detectors that has an increased output signal to achieve a better signal-to-noise ratio, and which can be more readily manufactured at a lower cost.

SUMMARY OF THE INVENTION

Accordingly, the present invention is directed to an array of superconductive quantum detectors, individual quantum detectors (SQD) and associated SQUID read-out that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the apparatus and method particularly pointed out in the written description and claims hereof as well as the appended drawings.

To achieve these and other advantages and in accordance with the purpose of the invention, as embodied and broadly described, the invention is an array of superconducting quantum detectors that includes a substrate, a plurality of spaced adjacent patterns of superconductive material deposited on the substrate, each said pattern having at least one pair of spaced legs, each pattern constituting a quantum detector; an input and an output current biasing node on each pattern between the legs of said at least one pair; a read-out superconductive SQUID including a pair of spaced Josephson Junctions coupled to the pattern; superconductive material connecting each output node to the input node of an adjacent pattern; a first DC current source connected to the input node of a first pattern; and a second DC current sources having positive and negative terminals, one-half of the negative terminals being connected to one-half of the plurality of SQUIDS and one-half of the positive terminals being connected to one-half of the SQUIDS. The remaining positive and negative terminals of the second DC current source are connected to a common ground.

In another aspect, the invention is a superconductive quantum detector comprising a substrate; an endless strip of superconductive material formed on the substrate in a generally serpentine pattern; a pair of spaced current biasing nodes positioned to geometrically segregate the serpentine pattern into first and second lengths; means shielding the first length from ambient light; means exposing the second length to photon radiation; said second length of the endless strip being responsive to the intensity of the photon radiation by a changing circulating current flowing in the serpentine pattern, such circulating current representing a change in kinetic conductance produced by de-pairing of Cooper pairs; and read-out means coupled to the pattern responsive to the circulating current for generating a signal having am amplitude corresponding to the intensity of photon flux striking the exposed length of the superconductive pattern and to the length of the endless strip.

In another aspect, the present invention is a method of optimizing kinetic inductance in a superconductive quantum detector for a given size and having an endless superconductive strip with a given Cooper pair mass, Cooper pair density and Cooper pair charge, said method comprising minimizing the cross-sectional area of the superconductive strip constituting the detector, and maximizing the length of said strip within the constraints of the given size.

In still another aspect, the present invention is a quantum detector that includes a substrate, a first endless thin film strip of superconductive material formed on the substrate, the first strip having an outer perimetrical boundary defined in part by at least two spaced legs and an additional length of the strip; a pair of spaced biasing current nodes on the first strip defining two portions of the first strip; a second thin film strip of superconductive material having opposite ends connected to the first thin film strip at spaced locations to form a read-out circuit; a pair of spaced Josephson Junctions formed in the second thin film strip between the connected opposite ends; and a read-out node on the second thin filmstrip between the spaced Josephson Junctions.

It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate several embodiments of the invention and together with the description serve to explain the principles of the invention.

DESCRIPTION OF PREFERRED EMBODIMENTS

Figure 1:
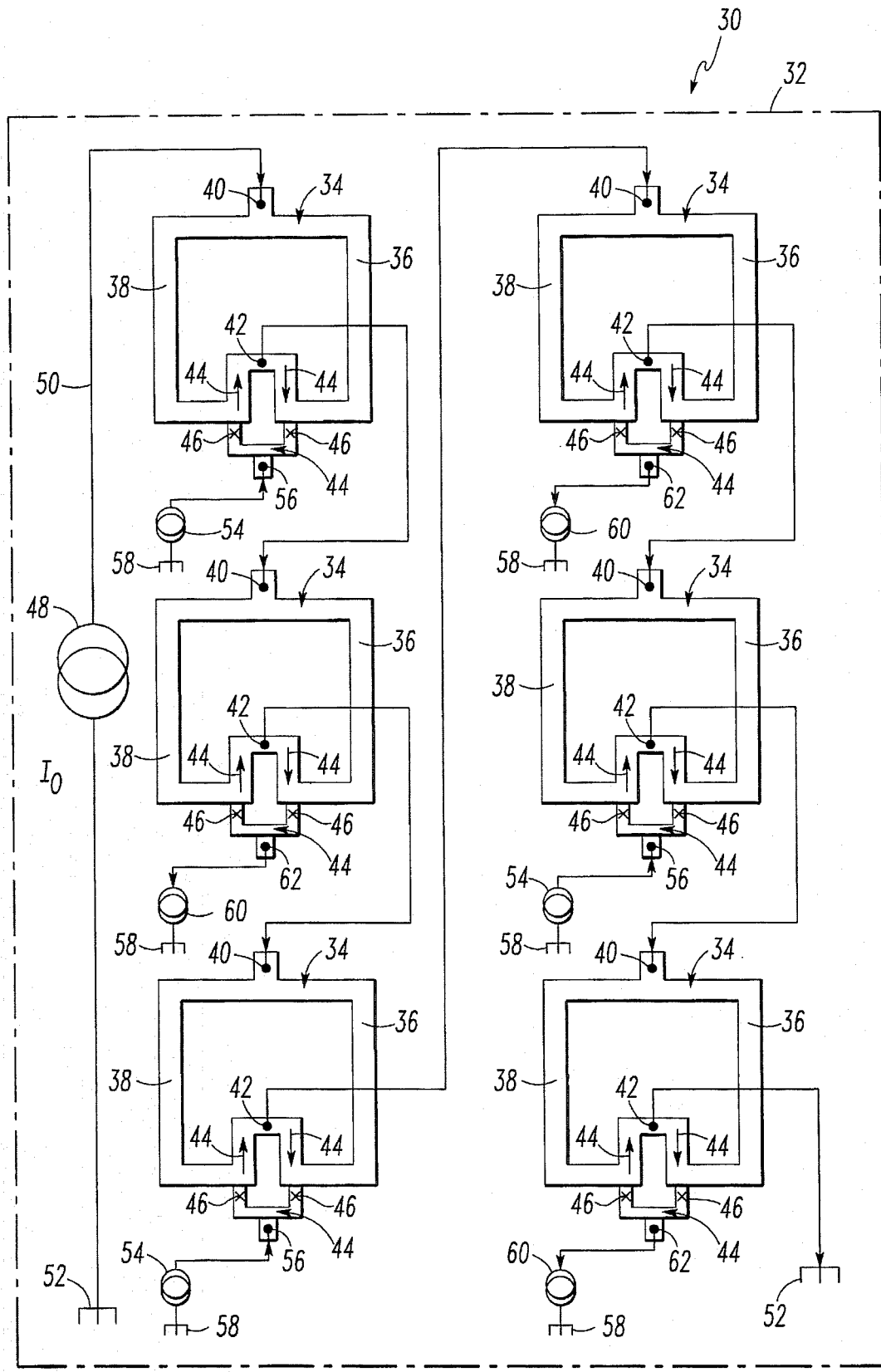
FIG. 1 is a schematic diagram of an array of superconductive quantum detectors and their associated SQUID read-outs in accordance with one embodiment of the present invention.

Superconductivity is defined as the absence of electrical resistance and the expulsion of a magnetic field, i.e., the Meissner effect. The superconducting phenomenon occurs at cryogenic temperatures in the neighborhood of 125°Kelvin or less, for example, when using the high temperature, well known superconductors, such as ceramic oxides, which are generally understood to be copper oxides, including but not limited to $YBa_2Cu_3O_7$, $La_{2-x}Ba_xCuO_4$, LaSrCuO, BiSrCaCuO, TlBaCaCuO. Also included is BaKBiO and the new low temperature elemental and compound superconductors such as Nb, Pb, NbN, $Nb_3S_n$, and $Nb_3Ge$, for example. Whenever the term superconductor(s), superconductive, superconducting material, or the like, is used in this application, it shall mean any material that is capable of becoming superconducting, regardless of the temperature, and regardless of whether such material has yet been identified.

Such superconductive material may take several forms including a thin film. The temperature at which a material actually becomes superconducting is referred to as the superconducting transition or critical temperature ($T_c$). The amount of superconducting current that a particular superconductor can carry is referred to as the critical current density ($J_c$).

Superconducting current is composed and transported by bound pairs of carriers referred to as "Cooper" pairs. The binding energy between paired carriers is commonly termed the order parameter or the superconducting energy gap. Coherence length is a measure of the distance within which the order parameter changes drastically in a spatially varying magnetic field. The Cooper pair condensate is represented as a wave function with an amplitude, and a phase, reflecting the phase coherence of the Cooper pairs. In a superconductor, this amplitude and phase coherence are maintained over macroscopic distances or coherence lengths. If all the Cooper pairs are broken in a certain portion, which extend completely across the width and thickness of the superconductor, the material becomes resistive and exhibits a resistance.

The lack of phase coherence across normal or insulating regions is used to make circuit elements commonly referred to as Josephson Junctions, which includes weak links and tunnelling junctions. These devices can be assembled into circuits known as superconductor quantum interference devices (SQUID). A weak link may be fabricated by connecting two superconductors with a thin normal metal, or a constriction made up of a short superconductor section of narrow width, or a superconductor above its transition temperature. A tunneling junction is formed by a tunneling oxide layer, for example. In these examples, the phase of the superconducting current can change across a weak link, since phase coherence is no longer maintained.

Reference will now be made in detail to the present preferred embodiments of the invention, examples of which are illustrated in the accompanying drawings. Like reference numerals refer to like parts throughout the drawings where possible.

In accordance with the present invention, an array of superconductive quantum detectors comprises a substrate; and a plurality of spaced endless strips of superconductive material deposited on the substrate with each of said strips being formed in a pattern having at least one pair of spaced legs, each endless strip constituting a quantum detector. As herein embodied, and referring to FIG. 1 an array 30 includes a substrate 32 of semiconductor material, preferably magnesium oxide ($M_gO$) or neodymium gallate ($NdGaO_3$), for example. A plurality of SQD's each of which includes an endless thin film strip of superconductive material deposited on the substrate are referenced at 34. Each of the thin films 34 is formed in a pattern having a pair of spaced legs 36 and 38. Each endless thin film 34, when partially exposed to radiant energy constitutes an active superconductive quantum detector. Each quantum detector of the present invention in the array 30 has a current input node 40 and a current output node 42 between the legs 36 and 38 of each detector of the array.

In accordance with the present invention, a read-out loop, forming a SQUID, is coupled to each superconductive quantum detector 34. As embodied in FIG. 1, the SQUID read-out loop includes the superconductive material that defines a path 44 indicated by arrows. The path 44 includes a pair of spaced Josephson Junctions referred to at 46. The array of the present invention also includes conductive material connecting each output node 42 to the respective input node 40 of an adjacent quantum detector thus connecting the plurality of quantum detectors 34 in the series. A current source 48 is connected by conductive material 50 to the input node 40 of the first quantum detector 34 of the series. The final quantum detector 34 of the series has an output node 42, preferably connected to ground 52. The SQUID read-out of the superconductive quantum detector of FIG. 1 is using a direct coupled approach as described in more detail hereinafter. With this direct read-out SQUID approach, there is a need for a SQUID bias current $I_{SQ}$ to cause the SQUID to operate properly in the voltage state.

In accordance with the present invention, a positive DC current source is connected to one-half of the SQUID read-out nodes and a common ground, and a negative DC current source is connected to the remaining half of the SQUID read-out nodes and the common ground. As herein embodied, positive DC current sources 54 are connected to read-out nodes 56 and common ground 58 of alternate detectors 34. Negative DC current sources 60 are connected to read-out nodes 62 and the common ground 58 at the remaining alternate detectors 34 of the series connected detectors of the array.

Thus, a photon sensor is made up of SQD's arranged in an array with read-out circuits incorporated for every single SQUID element in the array.

Figure 2:
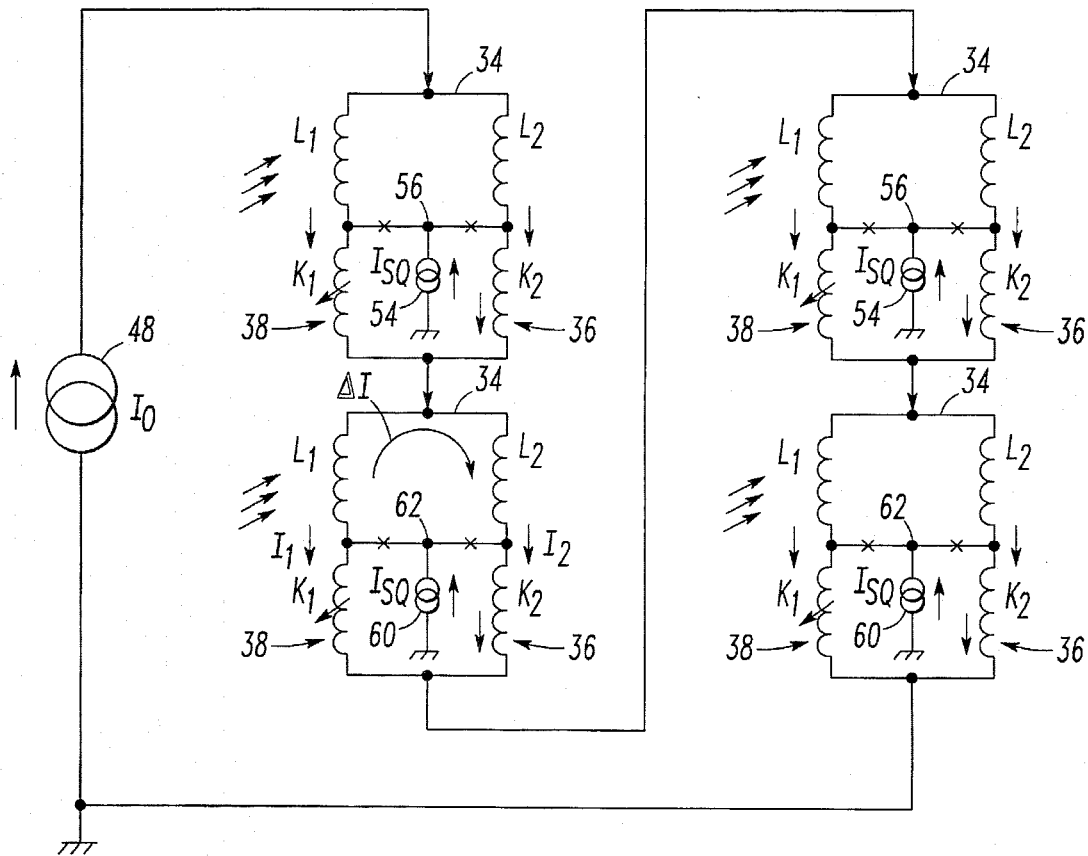
FIG. 2 is an equivalent circuit of the array of FIG. 1.

Referring to the equivalent circuit of FIG. 2, the superconductive quantum detector is a superconductive loop 34 biased with a DC current 48. The DC biased current 48 is carried within each SQD by the condensate which is represented by a wave function $$\Psi = (n)^{1/2} e^{i\theta}$$

wherein n is the condensate density and $\theta$ represents the phase of the condensate wave function. Since the condensate's wave function is single value in the loop 34, the current inside the loop has to satisfy the following equation:

$$(L_1 + K_1)I_1 - (L_2 + K_2)I_2 = 0 \quad (1)$$

Where $L_1$ is the geometrical inductance of branch 38, $L_2$ is the geometrical inductance of branch 36, $K_1$ is the kinetic inductance of branch 38, $K_2$ is the kinetic inductance of branch 36, $I_1$ is the current in branch 38, $I_2$ in the current in branch 36. Taking the differential of Eq. 1 for $L_1, L_2$ and $K_2$ constant. We obtain $$\Delta I_1 = -I_1 \frac{\delta I}{L_1 + L_2 + K_1 + K_2} \quad (2)$$

Where $\Delta I_1$ is the photoinduced circulating current in the SQD loop illustrated in FIG. 2. The read-out of this SQD is using the direct coupled SQUID approach. With this direct read-out SQUID approach a SQUID bias current $I_{SQ}$ causes SQUID to operate in the voltage state. Thus every sensor element will require two DC bias currents, one current $I_{SQ}$ for the SQD bias and a secondary current $I_{SQ}$ for biasing the read-out SQUID. The assembly of these sensor elements into a sensor array by connecting many single sensor elements or SQD's with the read-out circuit, and the number of interconnects should be minimized, to achieve optimum yield.

The current voltage characteristics of the read-out SQUID are symmetric. Thus, a positive or a negative $I_{SQ}$ current can be used to operate the read-out circuit. This feature will facilitate a 50 percent reduction in the number of interconnects needed between the SQUID's and the $I_{SQ}$ current generators. Such a large reduction in the number of interconnects is significant in facilitating higher yield and the assembly of the superconductive sensors into arrays. With all of the SQUID biased currents $I_{SQ}$ having the same direction, would require two connections for each SQUID read-out circuit for each detector. However, since the SQUID bias currents $I_{SQ}$ as shown in FIGS. 1 and 2 have opposite directions, the directly coupled SQUIDS can use the SQD bias line connected to current source 48 as a common ground. This eliminates the need for a second connection at each SQUID for removing the read-out circuit bias current $I_{SQ}$. With fifty percent of the currents in one direction and the other fifty percent of the read-out currents in the opposite direction, the net current injected into the SQUID read-out circuits relative to the common ground is zero. This reduces the number of current interconnects of the array by fifty percent. For an array with thousands of individual superconductive quantum detectors, this reduction means elimination of thousands of interconnects. Such elimination increases the array yield.

Although only one configuration of a superconductive quantum detector and directly coupled read-out has been shown in the array of FIG. 1, it is understood that all of the embodiments described in this application may be used as individual detectors and read-out circuits for the array. Also, other superconductive quantum detectors not disclosed in the present invention may be used in the array, and have the benefit of the feature that eliminates connections and thus improves yield and ease of manufacture of the present invention.

In accordance with the present invention, a superconductive quantum detector comprises a substrate with an endless generally serpentine pattern of superconductive material formed on the substrate.

Figure 3:
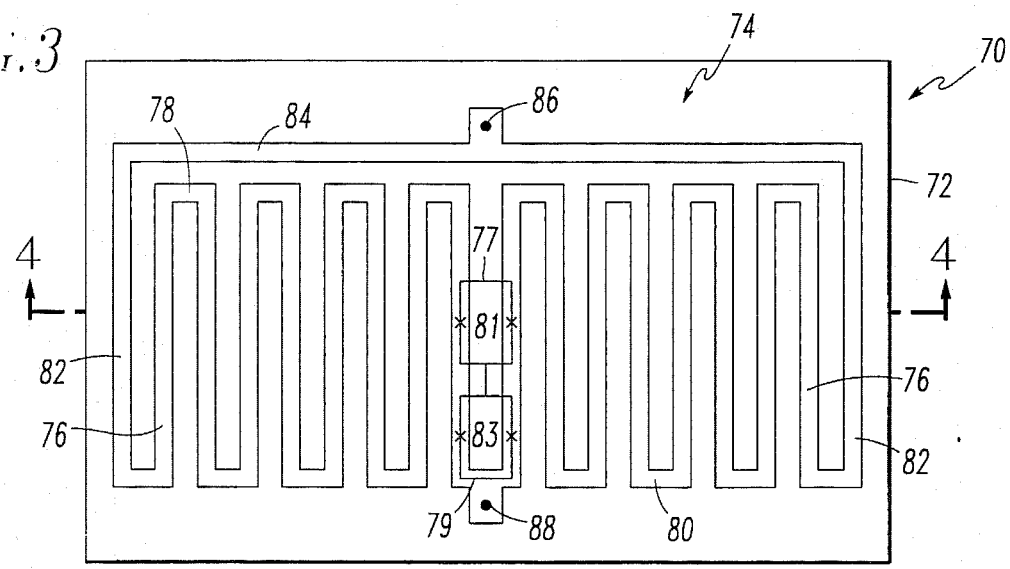
FIG. 3 is an enlarged top view of a superconductive quantum detector that may be used in the array of FIG. 1.

As herein embodied, and referring to FIG. 3, a superconducting quantum detector 70 has a semiconductor substrate 72 on which is formed a pattern of superconductive material in a generally serpentine pattern referred to as 74. The detectors of the first and second embodiments of the present invention has a plurality of spaced parallel legs 76 which are connected to adjacent legs at opposite ends 78 and 80. Outermost legs 82 which define opposite sides of the perimeter of the pattern 74 are connected at the one end 80 similar to the inner legs 76. At the opposite end of the outer legs 82, a length 84 of the superconductive material, which extends substantially perpendicular to the legs 76, connects the outer legs 82 to each other.

In accordance with the invention, a pair of spaced current biasing nodes are positioned to geometrically segregate the serpentine pattern into first and second lengths. As embodied herein and referring to FIGS. 3 and 4, a current biasing input node 86 is positioned on a tab extending from the length 84, and a current biasing output node 88 is positioned on a tab extending from adjacent legs 76 intermediate the outermost legs 82.

Magnetically coupled to the detector 70 are series connected SQUID read-out loops 77 and 79 made of a thin strip of superconductive material. Each loop includes a pair of Josephson Junctions 81 and 83. The SQUID loops are coupled to the spaced legs 76 at the central portion of the serpentine pattern. Depending on the application one or more SQUID read-out loops may be used with a single detector.

The invention also includes means for shielding the first length of the serpentine pattern from ambient radiation and means for exposing the second length of the serpentine pattern to ambient photon radiation. As embodied in FIG. 3 and 4, a transparent layer 90 overlays approximately one-half of the length of the serpentine pattern, and an opaque layer 94 is formed to overlay the remaining portion of the serpentine pattern 74. The input and output nodes 86 and 88 are preferably beneath the opaque layer. Although a transparent layer is shown, it is understood that the pattern can be exposed without a layer or have a filtering layer.

Figure 4:
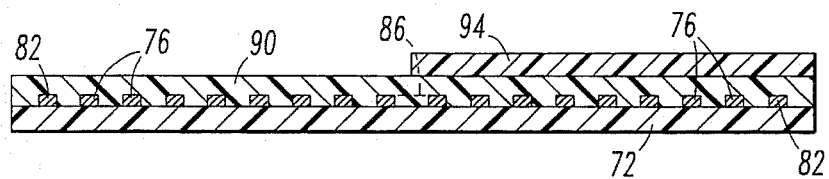
FIG. 4 is a cross sectional view of the quantum detector of FIG. 3 taken along line 4—4 of FIG. 3.
Figure 5:
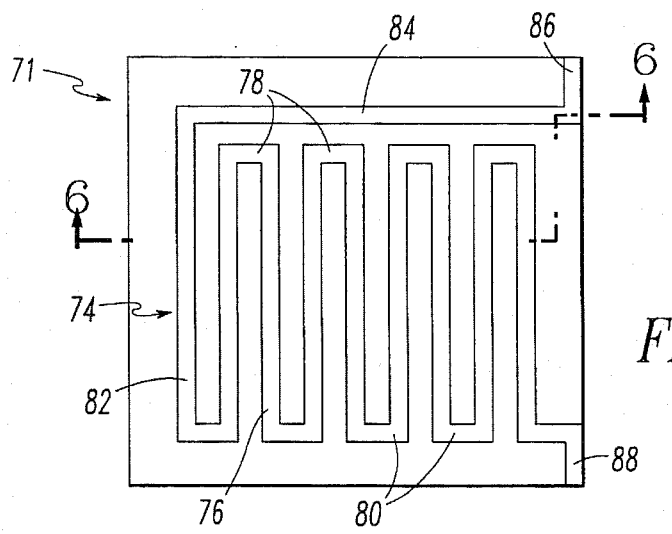
FIG. 5 is an enlarged top view of a superconductive quantum detector in accordance with a second embodiment of the present invention.
Figure 6:
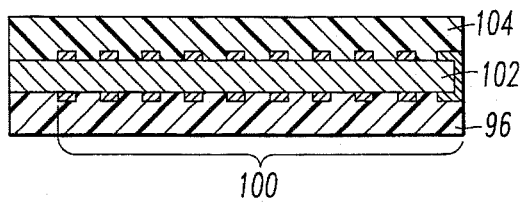
FIG. 6 is a cross sectional view of the superconductive quantum detector of FIG. 5 taken along line 6—6 of FIG. 5.

Referring to FIGS. 5 and 6, instead of overlaying a part of a pattern with a transparent layer and a part of the pattern with an opaque layer as in FIGS. 3 and 4, the pattern 74 is folded over on itself such that a structure 71 is provided that includes a substrate 96 and insulating layer 98 on which the shielded portion of the pattern 74 is formed, which pattern is referred to as 100. Overlaying the shielded portion of the pattern 100 is an insulative layer 102 on which the portion of the pattern exposed to ambient is formed, which in turn may have a transparent overlay 104. The substrate 72 and 96 may be $NdGaO_3$ or $M_gO$, for example. Layers 98 and 102 are preferably $SrTiO_3$.

The operation of the detector 70, which consists of the endless pattern 74 responds to a current $I_0$ that flows into the node 86 and divides into two currents $I_1$ and $I_2$. When the exposed portion of the pattern 74 is illuminated with light capable of breaking the Cooper pairs, then the kinetic inductance of said exposed portion will increase causing a change in the current division. The equation of constraints for this system is as follows:

$$I_1 + I_2 = I_0 \quad I_1(K_1 + L_1) = I_2(K_2 + L_2) \qquad (3)$$

Where $I_0$, $K_1$, $L_1$, and $I_1$, are respectively the SQD input bias current, the kinetic inductance of the exposed branch, the geometrical inductance of the exposed branch, and the current in the exposed branch. A similar notation is used for the current and inductances of the shielded branch.

Illumination changes the kinetic inductance of the exposed branch in FIG. 4 or 5, $K_1$ increase by $\Delta K_1$. This change is kinetic inductance $K_1$, produces a circulating current $\Delta I$ which corresponds to:

$$\Delta I = \frac{I_0 \Delta K_1}{K_1 + L_1 + K_2 + L_2} \qquad (4)$$

The circulating current $\Delta I$ produces a change in flux $\Delta \phi$ through the loop represented by:

$$\Delta \phi = I_0 \Delta K_1 \left[ \frac{L_1 + L_2}{K_1 + L_1 + K_1 + L_2} \right] \qquad (5)$$

A SQUID is used to read-out this flux signal. Equation 3 can be approximated as:

$$\Delta \phi = \frac{I_0 \Delta K_1}{2} \qquad (6)$$

Thus the maximum signal is produced for the largest change in the kinetic inductance $\Delta K_1$.

In accordance with the invention, we have discovered that a method for optimizing the kinetic inductance of a superconductive quantum detector having a given Cooper pair mass, Cooper pair density, and Cooper pair charge comprises minimizing a cross sectional area of a superconductive strip and maximizing the length of the strip within the confines of an outer perimeter. Thus, we have discovered that kinetic inductance can be maximized by using optimal geometry. Typically, for a superconducting strip line, the kinetic inductance can be expressed as:

$$K = \frac{l}{A} \cdot \frac{m}{ne^2} \qquad (7)$$

where the variables in this equation are: the length (l), the cross section (A), the mass of a cooper pair (m), the cooper pair density (n) and the charge of a cooper pair (e).

Figure 7:
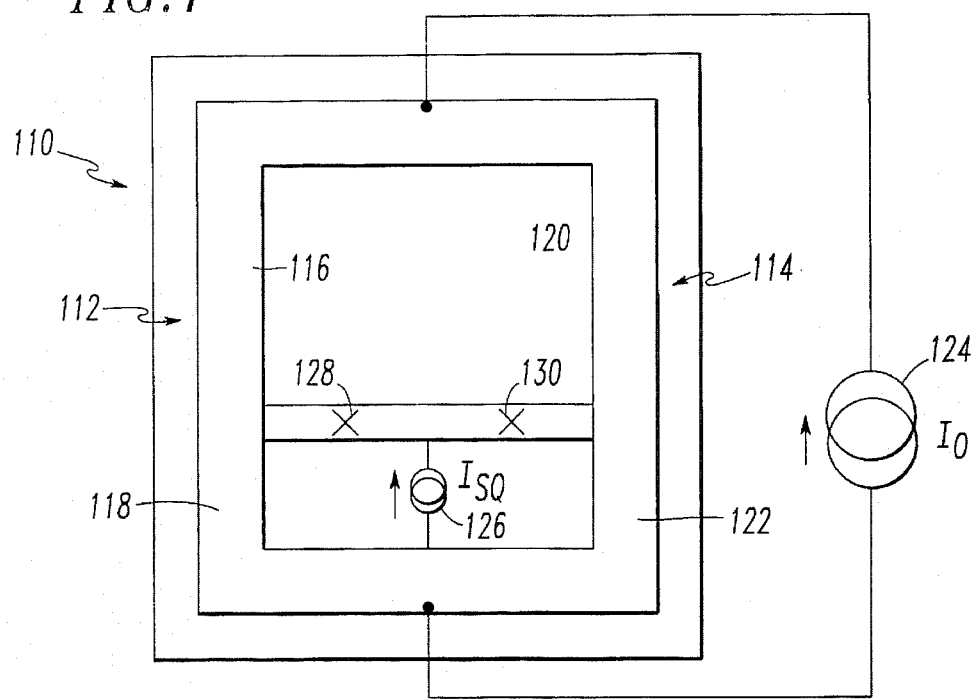
FIG. 7 is a schematic diagram of a superconductive quantum detector and directly coupled SQUID read-out in accordance with a third embodiment of the present invention.
Figure 8:
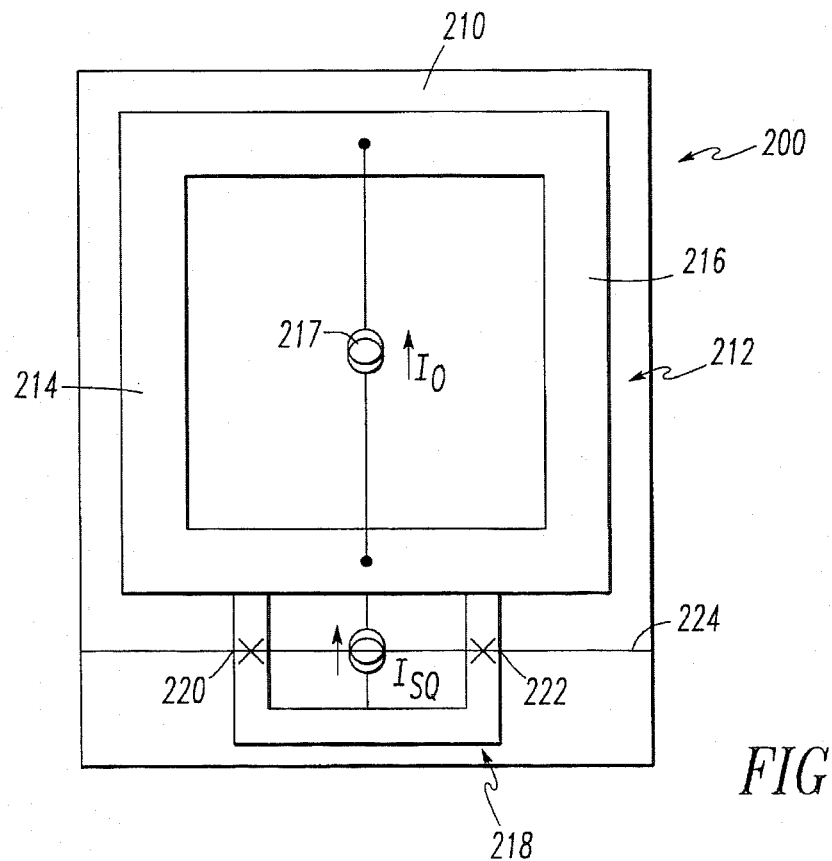
FIG. 8 is a schematic diagram of a superconductive quantum detector and associated directly coupled SQUID read-out in accordance with a fourth embodiment of the present invention.

If we replace the superconducting strip line of FIGS. 7 and 8 by a serpentine geometry superconductor (FIGS. 3, 5, and 14) the kinetic inductance for the serpentine geometry $K_{SG}$ will increase. Specifically, for the example given, the serpentine geometry kinetic inductance $K_{SG}$ will be:

$$K_{SG} = \frac{Nl}{(A/2N)} \cdot \frac{m}{ne^2} = [2N^2]K \qquad (8)$$

We have used the fact that the new length of the superconductor will be "N" times longer and the cross section will be 2N times smaller. Thus the effect is to increase the kinetic inductance $2N^2$ times over the simple geometry given in FIGS. 7 and 8.

It should be noted that the bias current $I_0$, that this serpentine pattern superconductor will be able to carry, is smaller by 2N, since the cross section of the superconductor has decreased by this factor.

Incorporating all these changes into equation (6) the serpentine geometry SQD (see FIG. 3) signal $\Delta \phi_{SG}$ will be $$\Delta \phi_{SG} = \frac{NI_0}{2} \Delta K \qquad (9)$$

Thus, the signal will increase N times for the same photon flux. Compare Equations 6 and 8.

In accordance with the invention, the superconductive quantum detector includes read-out means coupled to the superconductive pattern responsive to the circulating current for generating a signal corresponding to the intensity of the photon flux striking the exposed length of the superconducting pattern, the length of the endless strip, and the cross sectional area of the this strip.

Although, the benefits of the present invention can be realized by using a SQUID read-out that is magnetically coupled to the serpentine superconductive pattern, for applications where stray magnetic fields are undesirable, or where the fabrication of an array, for example, is complicated for a specific application, it is desirable to use a superconductive quantum detector having a SQUID read-out that is directly coupled to the detector pattern. For a detailed description of a superconductive quantum detector having a magnetically coupled SQUID reference is made to U.S. Pat. No. 5,179,072.

In accordance with the present invention, a direct coupled read-out SQUID comprises a thin strip of superconductive material having opposite ends directly coupled to the superconductive pattern of the quantum detector together with a pair of spaced Josephson Junctions formed in the thin strip between the connected opposite ends. The detector structure may correspond to the structure shown in FIG. 3, FIG. 5, FIG. 7, FIG. 8 or FIG. 14 as described herein. However, with a direct read-out SQUID, the exposed portion of the SQD to the photon flux may be different. For example, different exposed portions of the SQD are represented by corresponding equivalent circuits of FIGS. 17, 18, and 19.

In the illustrated equivalent circuits, the photons only strike the areas represented by a variable inductance. Thus, if the SQD of FIG. 7 or 8 is divided into four portions, light is incident only on the areas or portions represented by a variable inductor in the equivalent circuits of FIGS. 17, 18, and 19. Each SQD is biased with a $I_0$ current and the SQUID is directly coupled and biased with a DC current $I_{SQ}$. The two Josephson Junctions are designated by $\theta_1$ and $\theta_2$ in the FIGS. 17, 18, and 19. The equilibrium current in these circuits are $I_1$, $I_2$, $i_1$, and $i_2$. A photo induced change in the kinetic inductance produces current changes represented by $\delta_I$, $\delta i_1$, and $\delta i_2$. Using this convention, there is described and analyzed three examples of directly coupled read-outs for the SQD.

Figure 17:
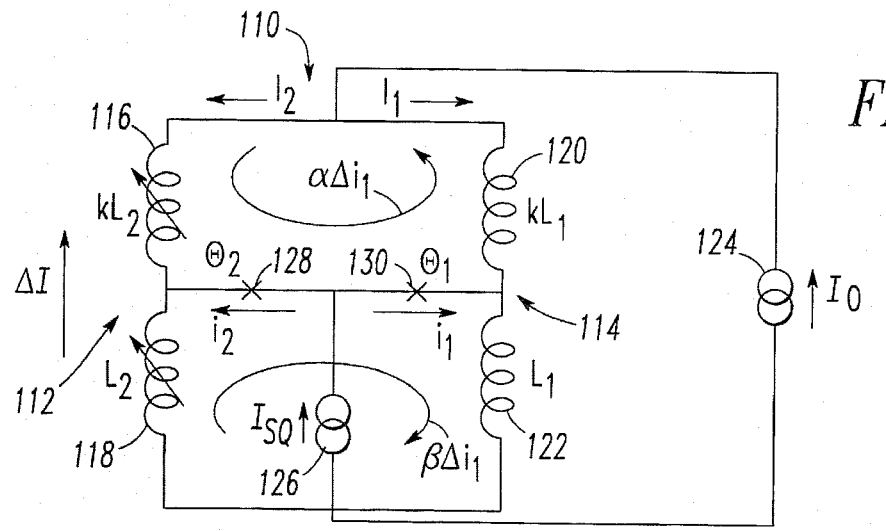
FIG. 17 is an equivalent circuit for a superconductive quantum detector of the present invention with illumination in the second and third portions of the detector pattern.

The detector of FIG. 7 will be described in connection with the equivalent circuits of FIGS. 17, 18, and 19. For purposes of explanation, a detector 110 is considered to have two branches: namely, branch 112, which constitutes approximately the left half of the detector loop or endless strip 110, and a branch 114 which includes the right half of the detector loop 110. The left branch 112 is further divided into an upper left hand portion 116 and a lower left hand portion 118 as viewed in the drawing. The right hand branch 114 is described as having an upper right hand portion 120 and a lower right hand portion 122. Thus, in the equivalent circuit of FIG. 17, only the left branch 112 which includes the second and third portions 116 and 118 of the SQD are illuminated, as represented by the variable inductors. As shown in FIGS. 7 and 17, the bias current for the SQD is $I_{SQ}$ from a current source 124 and the SQUID bias current is $I_{SQ}$ from a current source 126. The current $I_{SQ}$ from the source 126 is assumed to be larger than the combined zero voltage state current capacity of the two SQUID's 128 and 130, which are referred to as $\theta_1$ and $\theta_2$ of the equivalent circuit. For an ideal situation, $L_2$ equals $L_1$ and the constant C equals 1. Before illumination $\delta$, I, $\alpha\Delta i$, and $\beta\Delta i$, are all equal to zero. The variables $\alpha$ and $\beta$ are geometrically dependent, and $\alpha$ plus $\beta$ equals 1.

With exposure to a photon flux $\Psi$, the kinetic inductance change, by $\Delta K$ and offset current $\Delta I$, $\alpha\Delta i_1$, and $\beta\Delta i_2$ are produced. The induced current $\Delta I$ with photon flux in the equivalent circuit shown in FIG. 17 will be:

$$\Delta I = \frac{\Delta K}{4} \frac{[(C+1)I_0 + I_{SQ}]}{\mathcal{L}_1(C+1)} \quad (10)$$

Similarly, the photoinduced current $\Delta i$ in the SQUID can be expressed as:

$$\Delta i = \frac{1}{4} \left( \frac{\Delta K}{\mathcal{L}_1} \right) I_{SQ} \quad (11)$$

This can be changed into an expression for the voltage change $\Delta V$ across the R/O SQUID and given by:

$$\Delta V = \left( \frac{I_{SQ}R}{4} \right) \left( \frac{\Delta K}{\mathcal{L}_1} \right) \frac{1}{\sqrt{\gamma^2 - 1}} \quad (12)$$

Where R is the shunting resistance across each Josephson Junction and $\gamma=I_{SQ}/2i_c$ where $i_c$ is the critical current of the Josephson Junction. The inductance $\mathcal{L}_1$ includes the geometrical and kinetic inductance terms for each portion.

FIG. 7 will now be described in connection with the equivalent circuit of FIG. 18. This example is similar to the previously described example except the photon illumination strikes only the detector portion 118. In the equivalent circuit of FIG. 18, the constant $\alpha$ and $\beta$ are eliminated, and instead we are using $\delta i_1$ and $\delta i_2$. The operation of the SQD of FIG. 18 is as described for the SQD of FIG. 17.

The induced current $\Delta i = \Delta i_1 + \Delta i_2$ in the directly coupled SQUID's current and is given by:

$$\Delta i = \frac{1}{4} \left( \frac{\Delta K}{\mathcal{L}_1} \right)(I_0 + I_{SQ}) \quad (13)$$

Here also note that $\mathcal{L}_2=\mathcal{L}_1$.

Because illumination is only in the portion 118 the induced SQUID current ($\Delta i$) is different from the situation, where illumination is on the portions 116 and 118.

By comparing Equation 13 to 11 it is seen that there is a larger signal for the detector having just the portion 118 illuminated because $I_0+I_{SQ}>>I_{SQ}$.

The voltage signal produced across the SQUID in response to illumination is:

$$\Delta V = [(I_0 + I_{SQ})R] \left( \frac{\Delta K}{4\mathcal{L}_1} \right) \frac{1}{\sqrt{\gamma^2 - 1}} \quad (14)$$

Clearly the signal is significantly larger when only the portion 118 is illuminated than when the entire left half 112 is illuminated.

Figure 19:
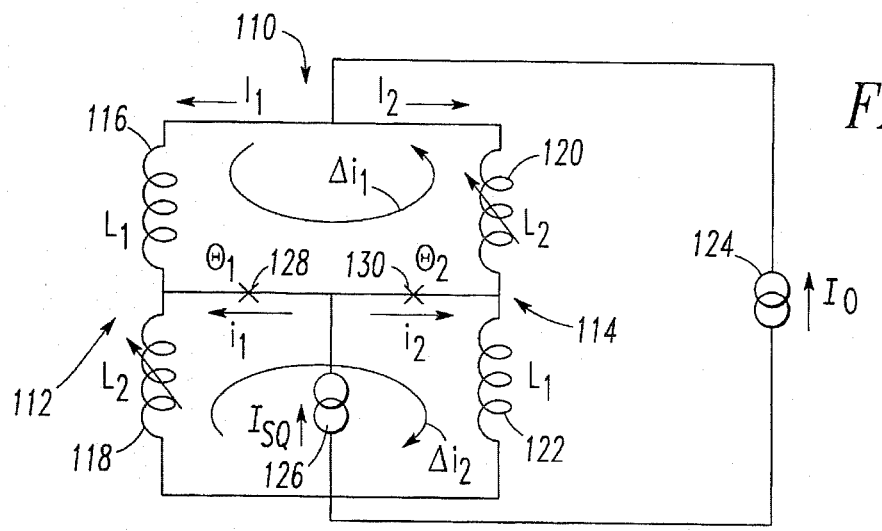
FIG. 19 is an equivalent circuit of a superconductive quantum detector of the present invention illustrating illumination in the first and third portions of the detector pattern.

Referring to the equivalent circuit of FIG. 19 in conjunction with FIG. 7, illumination is incident on the portions 118 and 120 of the detector 110. By performing the computations similar to those described in connection with the previous examples, the induced SQUID current $\Delta_1$ is obtained in accordance with the following expression:

$$\Delta i = \left( \frac{\Delta \mathcal{L}}{4\mathcal{L}_1} \right)(2I_0 + I_{SQ}) \quad (15)$$

The voltage across the SQUID developed because of this current change $\Delta i$ is given by:

$$\Delta V = [(2I_0 + I_{SQ})R] \left( \frac{\Delta K}{4\mathcal{L}_1} \right) \frac{1}{\sqrt{\gamma^2 - 1}} \quad (16)$$

It should be noted that Equations 13 and 14 are similar to Equations 15 and 16 except for a factor of 2. The factor of 2 accounts for the two portion illumination in the present example relative to the previous described example corresponding to FIG. 18.

Figure 18:
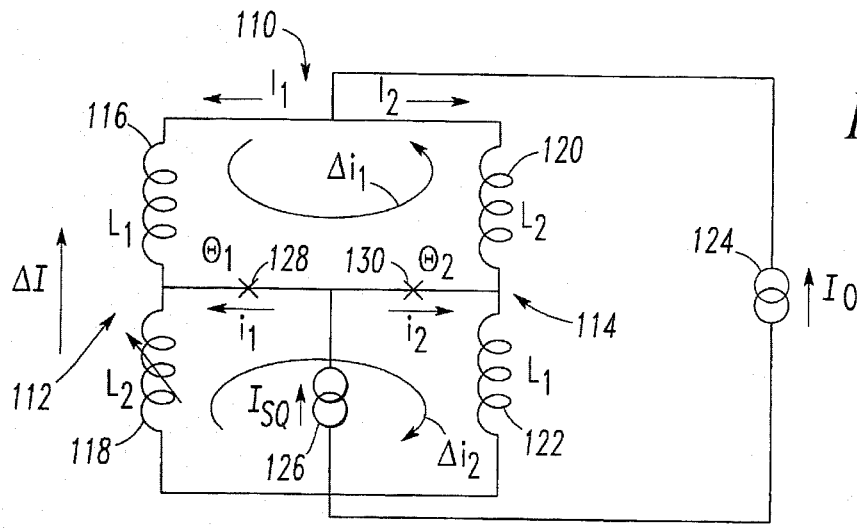
FIG. 18 is an equivalent circuit for a superconductive quantum detector of the present invention with illumination in the third portion only.

Using Equations 12, 14 and 16 we can relate the output SQUID voltage to the photon flux $\Psi$ for examples illustrated by equivalent circuits of FIGS. 17, 18 and 19. The change in Kinetic inductance $\Delta K$ can be related to the photon flux ($\Psi$), the quasiparticle lifetime ($\tau_{eff}$) and the thickness (d) of the SQD strips.

If we assume that the geometrical inductance is about equal to the kinetic inductance, then the change in ΔK can be readily expressed as:

$$\left(\frac{\Delta K}{\mathcal{L}_1}\right) \approx \frac{1}{2}\left(\frac{\Delta n_{cp}}{n_{cp}}\right)\frac{1}{2}\frac{\Psi \tau_{eff}}{n_{cp}d} \quad (17)$$

Where $n_{cp}$ is the Cooper pair density and $\Delta n_{cp}$ represents the photoinduced change in the equilibrium Cooper pair density.

Substituting Equation 17 into Equations 12, 14 and 16 a relationship between ΔV and Ψ is obtained. It should be evident that for maximum signal τeff should be made as large as possible.

Three examples of a SQD with directly coupled SQUID read-out circuits are considered, where each example represents a different illumination pattern of the SQD. The largest signal is for the last described example of FIG. 19, and the smallest signal is for the first described example of FIG. 17. The signal ratio between these example is $(2I_0/I_{SQ})$. This is a significant difference because $I_0 >> I_{SQ}$.

The superconductive quantum detectors of the present invention may include several types of Josephson Junctions. For example, a step type junction may be used as shown in FIG. 9, an edge type junction as shown in FIG. 10, and a grain boundary junction as shown in FIG. 12 may be used, as well as the well-known tunneling type junction as shown in FIG. 13.

Figure 9:
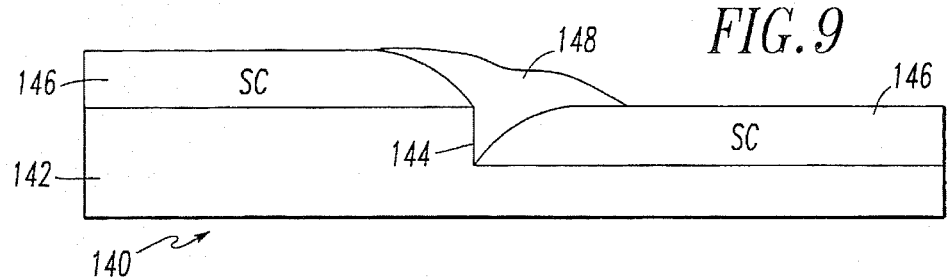
FIG. 9 is a highly magnified sectional view of a step type Josephson Junction that may be used in forming a SQUID for reading out the superconductive quantum detectors of the present invention.

As shown in FIG. 9, a step type junction generally referred to as 140 includes a substrate 142 that is preferably made of a material, such as NdGaO$_3$ or M$_g$O. The substrate 142 has as step 144 to define an upper level and a lower level of the substrate. A superconductive material, 146 is deposited on the lower level of the substrate at one side of the step 144 and superconductive material 146 is also deposited on the substrate upper level at the other side of the step 144. This step provides discontinuity between the superconductive two parts of the materials 146. A layer of gold 148 is deposited to contact the superconductive material 146 on both levels of the step 144.

Figure 10:
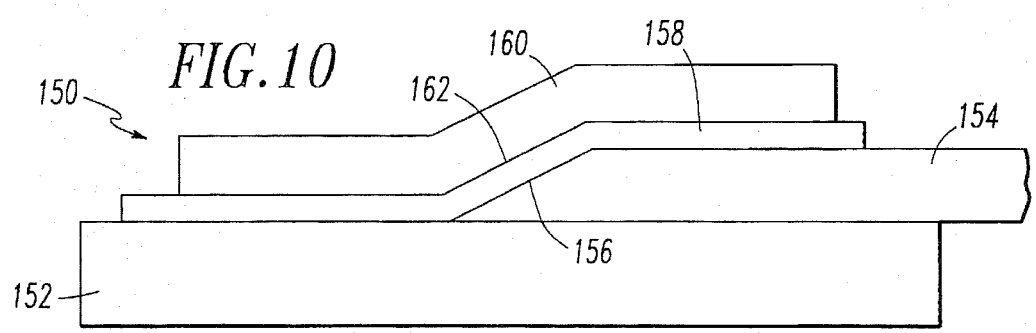
FIG. 10 is a sectional view of a highly magnified Josephson Junction of the edge type that may be used in forming a SQUID for reading out the superconductive quantum detectors of the present invention.

Referring to FIG. 10, an edge type Josephson Junction is generally referred to at 150. Junction 150 includes a substrate 152 which is preferably, for example, made of NdGaO$_3$ or M$_g$O. Overlaying the substrate is superconductive material 154. The layer 154 has a sloping or ramp type face 156. Epitaxially grown on the substrate 152, the superconductive layer 154, and covering the ramp 156 is a non-superconductive layer 158 that overlays the ramp portion 156. The non-superconductive layer 158 preferably calcium doped YBCO. Overlaying the second layer 158 is another layer of superconductive material 160 that also overlays the ramp 156. The junction between layers 160 and 154 is at the ramp edge located between portions 162 and 156.

Figure 11:
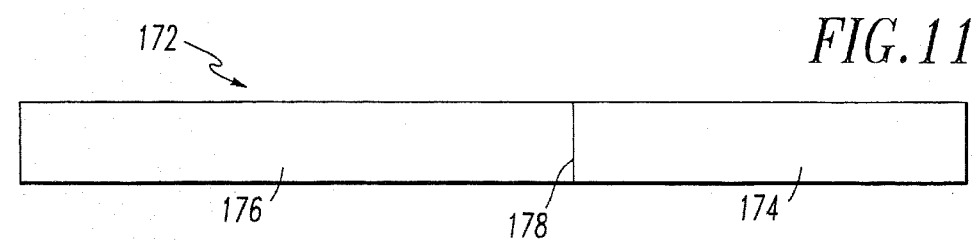
FIG. 11 is a highly magnified sectional view of a bicrystal substrate used during the process of making a Josephson Junction of the grain boundary type of FIG. 12.
Figure 12:
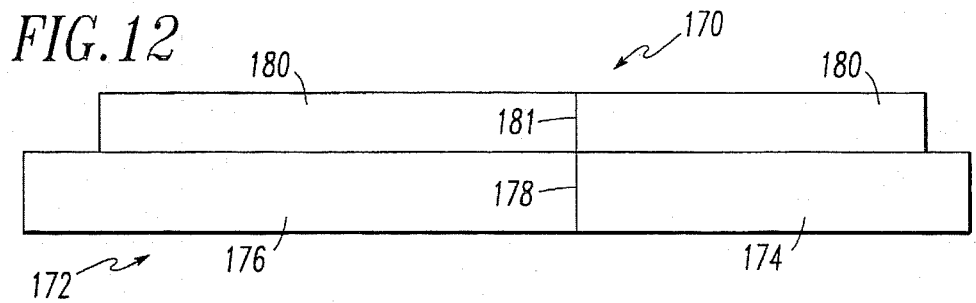
FIG. 12 is a highly magnified sectional view of the grain boundary type of Josephson Junction for use in forming the SQUID for reading out the superconductive quantum detectors of the present invention.
Figure 13:
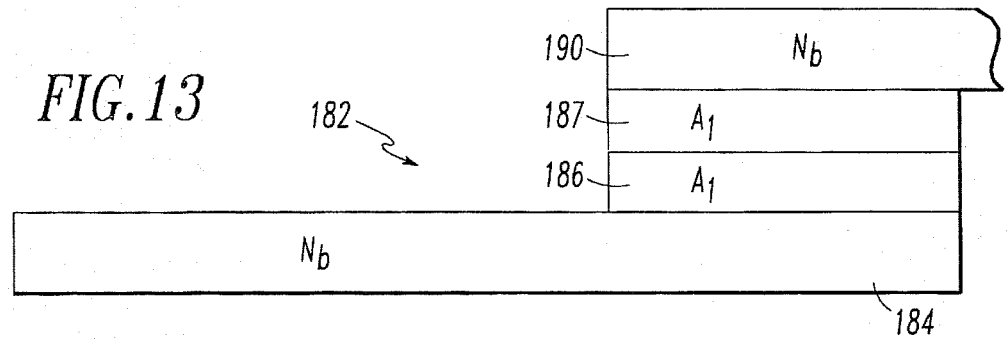
FIG. 13 is a highly magnified sectional view of a tunneling type Josephson Junction made of niobium, for example, that may be used in forming a SQUID for reading out the superconductive quantum detectors of the present invention.

Referring to FIG. 12, a grain boundary type junction is generally referred to at 170. The grain boundary junction 170 has a substrate 172 (see FIG. 11) that is composed of two parts 174 and 176. Substrate portions 174 and 176 have lapped end faces 178 that abut one another to provide the bicrystal boundary. The orientation of the two substrate portions is preferably in the range of 10 to 30 degrees relative to one another. Epitaxially grown on the substrate 172 is a superconductive material 180. The superconductive layer 180 includes a grain boundary that is formed because the superconductive material grows in accordance with the orientation of the substrate beneath the layer. Thus, a grain boundary 181 is formed in the superconductive material.

FIG. 13 shows a tunneling type Josephson Junction at 182. A superconductive layer Nb referred to at 184 has an aluminum layer 186 deposited thereon. An aluminum layer oxide Al$_2$O$_3$ layer 187 is grown on layer 186. Overlaying thin aluminum oxide layer 187 is a superconductive material 190 which is preferably Nb.

The SQUID output signal for the step junction of FIG. 9 is the voltage developed across the step 144 between the superconductive layers 146. The voltage for the edge junction is developed across the ramp 156 and 162. In the grain boundary junction, the voltage for the SQUID output signal is developed across the grain boundary 181.

Figure 16:
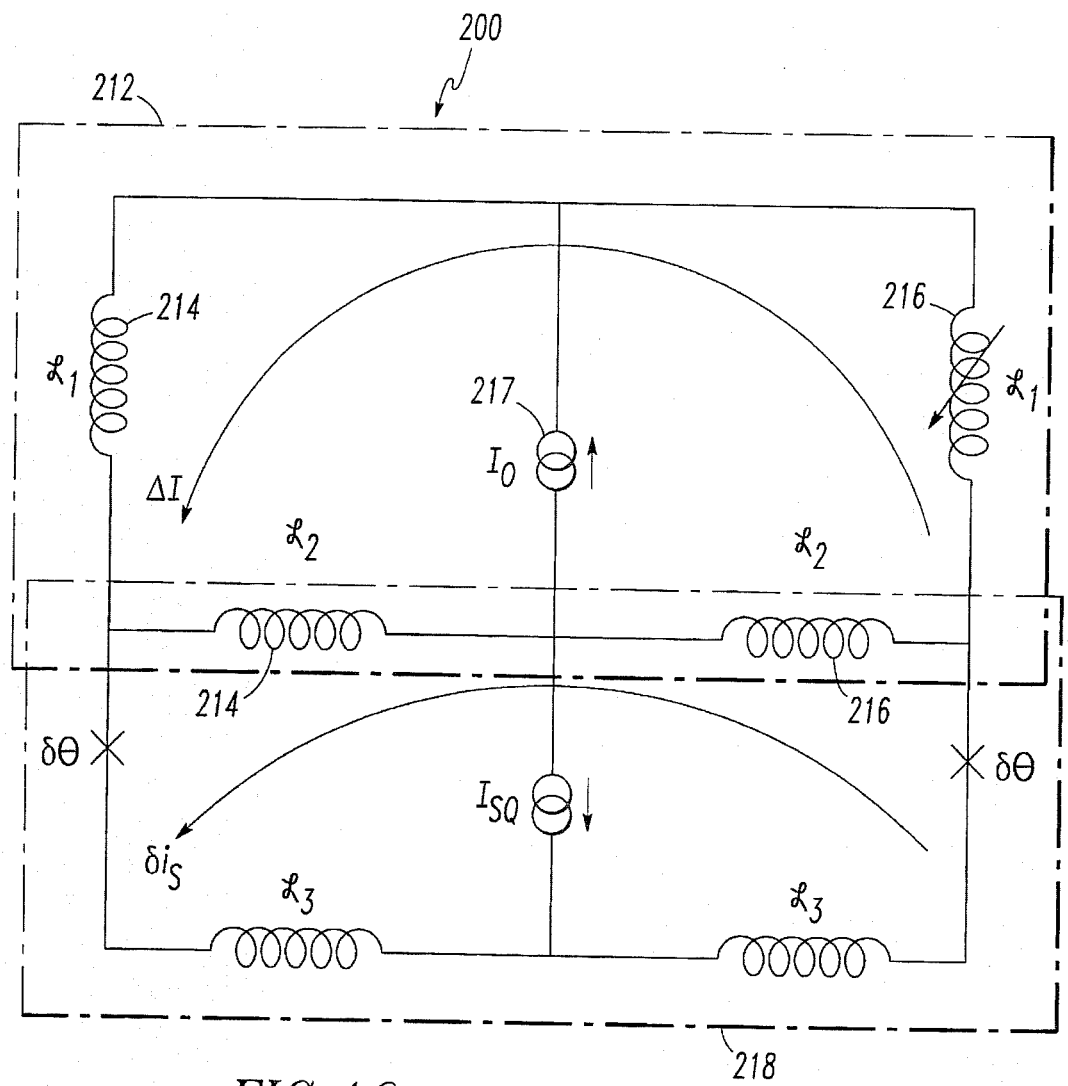
FIG. 16 is an equivalent circuit for a superconductive quantum detector with a directly coupled SQUID read-out in accordance with a fifth embodiment of the present invention.

In accordance with the present invention, a SQUID read-out comprises a thin strip of superconductive material formed on the substrate outside of the perimetrical boundary of the detector. As herein embodied, and referring to FIG. 8 and the equivalent circuit of FIG. 16 a superconductive quantum detector with a directly coupled read-out is referred to at 200. The detector 200 has a substrate 210 on which is deposited an endless strip of superconductive material 212 having a pair of spaced legs 214 and 216. Biasing current connected to the detector is referred to at 217. The SQD 200 has a directly coupled SQUID read-out circuit connected at the bottom of the SQD endless pattern or loop, which read-out circuit is referred to at 218. This, of course is a different embodiment than the device described in connection with FIG. 7. The SQUID 218 has a thin strip of superconductive material in a general U-shaped configuration with opposite ends directly coupled to the endless strip 212. Intermediate the opposite ends of the SQUID 218 are a pair of spaced Josephson Junctions 220 and 222. With the outside SQUID configuration of FIG. 8, a bicrystal at line 224 can be used to implement the Josephson Junctions as described in connection with FIG. 12. This configuration is particularly advantageous in fabricating high temperature superconductive SQD/SQUID devices where the high temperature superconductive SQUID technology is difficult. The embodiment of FIG. 8 has an additional advantage with the direct coupling and integration of an Nb read-out SQUID circuit as shown in FIG. 13. This direct coupling is a significant advantage because it dispenses with the need for two insulative layers between Nb circuits and the high temperature superconductive film. Such insulating layers complicate the process and tend to destroy the high temperature superconductive film. Referring to FIG. 16, the SQUID read-out 218 is represented by the inductors $\mathcal{L}_2$ and $\mathcal{L}_3$ and a DC current generator $I_{SQ}$. The SQD device 212 is represented by inductors $\mathcal{L}_1$ and $\mathcal{L}_2$ and the DC current generator $I_{SQ}$. The inductors $\mathcal{L}_1$, $\mathcal{L}_2$, and $\mathcal{L}_3$ include the geometrical and kinetic inductances. Inductor $\mathcal{L}_1$ in the SQD is shown as a variable inductor (illuminated) that changes with the amount of Cooper pairs broken by photon absorption. Since only one part of the SQD illuminated, it is represented by a variable inductor $\mathcal{L}_1$ and all the other inductors in FIG. 16 are represented as fixed. Illumination of the inductance $\mathcal{L}_1$, produces a signal current ΔI in the SQD loop 212 and a signal current $\delta i_s$ in the SQUID. In a superconductor, the sum of all the phase changes around a closed loop is n2π, where n=0, 1, 2 . . . This restriction is used to write operating equations for the device of FIG. 8. It should be noticed that only the deviation from the equilibrium operation is of interest. Equilibrium operation is defined as the operation of a symmetrical device where $I_0$ and $I_{SQ}$ divide equally between the left leg 214 and the right leg 216 in FIGS. 8 and 16. The effect of a photon signal is to change $\mathcal{L}_1$ by $\delta\mathcal{L}_1$ and produce the signal current ΔI and $\delta i_s$.

The equations for the signal current ΔI in the SQD loop (see FIG. 16) is:

$$(\Delta I - \delta i_s) 2\mathcal{L}_2 + 2\mathcal{L}_1 \Delta I + \delta\mathcal{L}_1 \frac{I_0}{2} = 0 \quad (18)$$

But since $\mathcal{L}_1 \gg \mathcal{L}_2$ and $\Delta I \gg \delta I_2$, Equation (18) can be rewritten as:

$$\Delta I = \frac{-I_0}{4(\mathcal{L}_1 + \mathcal{L}_2)} \delta\mathcal{L}_1 \quad (19)$$

The equations for the SQUID loop, in FIG. 16 is:

$$\left(\frac{\phi_0}{2\Pi}\right) 2\delta\theta - 2\mathcal{L}_2(\Delta I - \delta i_s) + 2\mathcal{L}_3 \delta i_s = 0 \quad (20)$$

Where $\phi_0 = 2 \times 10^{-13}$ webars and $\delta\theta$ is the phase change across each Josephson Junction in response to a signal current $\delta i_s$. With a feedback arrangement, the value of $\delta\theta$ can be made very small and Equation 20 is simplified. Combining Equations (9) and 20 a simplified expression is obtained for the signal current in the SQUID:

$$\delta i_s = \frac{-I_0 \delta\mathcal{L}_1}{4(\mathcal{L}_1 + \mathcal{L}_2)} \quad (21)$$

Figure 14:
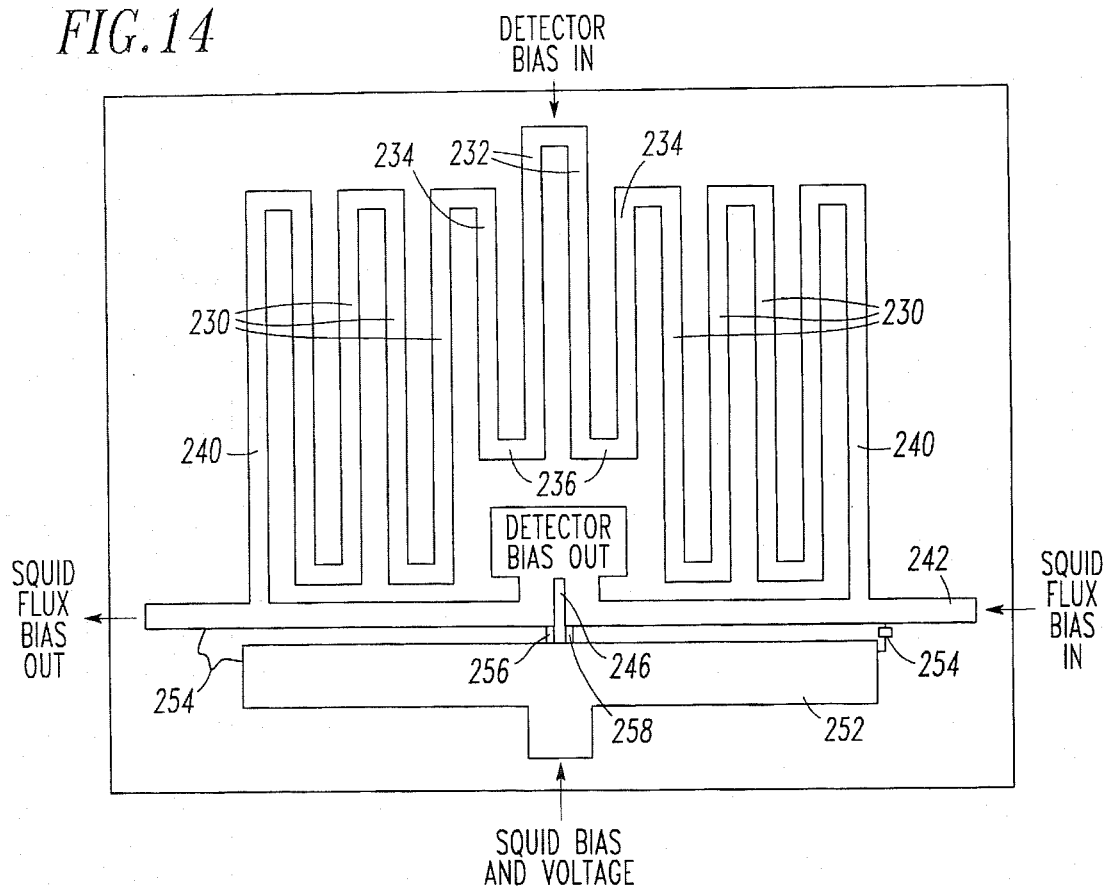
FIG. 14 is a highly magnified schematic plan view of a superconductive quantum detector in conjunction with a directly coupled SQUID read-out in accordance with a fifth embodiment of the present invention.
Figure 15:
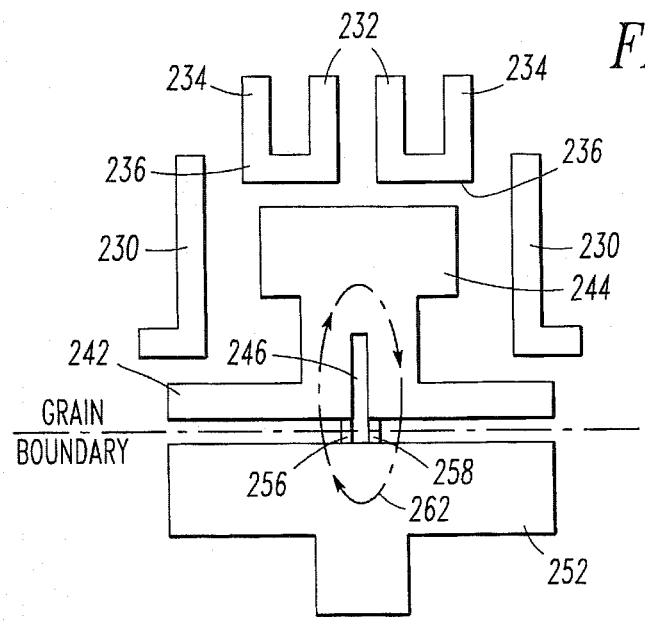
FIG. 15 is a highly magnified view of the SQUID directly coupled read-out of the quantum detector within the dashed line circle of FIG. 14.

As shown from the foregoing, to obtain a maximum SQUID signal the value of $\mathcal{L}_3$ in FIG. 16 should be minimized. To minimize the $\mathcal{L}_3$, the SQD geometry is made small and the SQD utilizes the serpentine pattern layout to increase the kinetic inductance relative to the geometrical inductance and thereby make $\delta\mathcal{L}_1$ significant. As embodied herein, and referring to FIG. 14, is a superconductive quantum detector having a serpentine configuration with a directly coupled SQUID as configured to minimize $\mathcal{L}_3$ and maintain $2(\mathcal{L}_3 + \mathcal{L}_2) I_c = \phi_0$. FIG. 14 and FIG. 15 include a thin strip of a superconductive material having a thickness of approximately a London penetration depth, for example, one hundred fifty nanometers for YBCO and a width of approximately six microns. The thin film strip is configured in the form of a plurality of spaced parallel legs 230 that are connected at opposite ends to adjacent legs. A pair of spaced parallel legs 232 are configured intermediate the legs 230 to extend outwardly from the top boundary of the endless strip as viewed in the drawing to provide an input node for the biasing current of the detector. On opposite sides of the spaced parallel legs 232 are a pair of legs 234 that connect at opposite ends to legs 232 at 236 inwardly of the legs 230 to form a void 238. Connecting the outermost legs 240 to one another thus completing the endless strip of superconductive material is a length 242 that extends substantially perpendicular to the lengths of the spaced parallel legs 232 and 234. The lengths 242 extend inwardly into the void 238 to almost completely fill the void but remain spaced from the parallel legs to provide an output node 244 for the detector. The length 242 also has a narrow slit 246 intermediate the outermost legs 240 that extends inwardly to a neck portion 248 to define the interior of a SQUID loop. A pair of Josephson Junctions 256 and 258 are shown between the strip 242 and 252. Resistors 254 are shown connecting the superconductive strip 252 to the superconductive length 242 for use with the tunneling type Josephson Junctions. However, where the grain boundary type of Josephson Junctions are used, as shown in FIG. 15, no resistors are required. The SQUID loop is defined as a path that surrounds the slit 246 and the Josephson Junctions 256 and 258 as shown by the solid line 262 in the enlarged view of FIG. 15.

It will be apparent to those skilled in the art that various modifications and variations can be made in the apparatus and method of the present invention without departing from the spirit or scope of the present invention. Thus, it is intended that the present invention cover the modifications and variations of this invention provided they come within the scope of the appended claims and their equivalents.

We claim:

1. An array of superconductive quantum detectors, comprising
   a substrate;
   a plurality of spaced adjacent patterns of superconductive materials deposited on the substrate, each said pattern being endless and having at least one pair of spaced legs, each said pattern being a quantum detector;
   an input and output current biasing node on each pattern between the legs of said at least one pair;
   a read-out superconductive quantum interference device including a pair of spaced Josephson junctions coupled to each pattern;
   conductive material connecting each output node to the input node of an adjacent pattern, a first DC current source connected to the input node of a first pattern; and
   a second DC current source having positive and negative terminals, one-half of the negative terminals being connected to one-half of the read-out superconductive quantum interference devices of the array, one-half of the positive terminals being connected to the remaining superconductive quantum interference devices of the array, the remaining positive and negative terminals of the second source being connected to grounds.

2. The array of claim 1 wherein each of the plurality patterns are formed in a general serpentine configuration.

3. The array of claim 1 wherein each of the plurality of patterns comprises a plurality of spaced legs connected at opposite ends to adjacent legs, and outermost legs of the spaced legs being connected by a length of superconductive material extending transverse to said plurality of legs.

4. The array of claim 3 wherein each of the readout devices comprises a strip of superconductive material having opposite ends directly coupled at spaced locations to the transverse length of the pattern, and a pair of spaced Josephson junctions formed in said strip intermediate the opposite ends.

5. The array of claim 1 wherein each of the plurality of patterns has an outer perimeter, and each read-out superconductive quantum interference device is formed on the substrate within said outer perimeter.

6. The array of claim 1 wherein each of the plurality of patterns has an outer perimeter and each read-out superconductive quantum interference device is formed on the substrate exterior of said outer perimeter.

7. The array of claim 6 wherein each of the readout superconductive quantum interference devices includes a Josephson junction of the grain boundary type.

8. The array of claim 1 wherein each of the endless patterns includes a portion exposed to radiant energy and a shielded portion, each detector generating an output signal based upon total length of a superconductive strip of each pattern and the specific portions of each pattern exposed to radiant energy.

9. The array of claim 8 wherein the exposed portion of each pattern comprises a first and second exposed portion with shielded portions separating said portions.

10. The array of claim 1 wherein each pattern includes an endless strip of superconductive material having a width of approximately one hundred fifty and a thickness of approximately six microns, said material being YBCO.

11. A superconductive quantum detector, comprising a substrate;
   an endless thin film strip of superconductive material formed on the substrate in a generally serpentine pattern;
   a pair of spaced current biasing locations positioned to geometrically segregate the serpentine pattern into first and second lengths;
   means shielding the first length from ambient light;
   means exposing the second length to photon radiation, said second length of the endless strip being responsive to the intensity of the photon radiation to change circulating current flowing in the endless pattern, such circulating current representing the change in kinetic inductance produced by de-pairing of Cooper pairs; and
   read-out means coupled to the pattern responsive to the circulating current for generating a signal corresponding to the intensity of photon flux striking the exposed length of the superconductive pattern and the length of the endless strip.

12. The detector of claim 11 wherein the endless thin film strip is in the form of a pattern having a plurality of spaced parallel legs of substantially equal length connected at opposite ends to adjacent parallel legs.

13. The detector of claim 12 wherein the spaced legs have outermost legs at opposite ends of the pattern connected by a section of the pattern extending perpendicular to the direction of the parallel legs.

14. The detector of claim 11 wherein the read-out means comprises an inductively coupled loop insulatedly spaced from and in registry with the serpentine pattern of the endless thin film strip.

15. The detector of claim 11 wherein the read-out means comprises a superconductive thin film having opposite ends; and a pair of spaced Josephson junctions directly coupling the superconductive strip of the readout means to the serpentine pattern.

16. The detector of claim 11 wherein the endless thin film strip has a width of approximately six microns and the parallel legs are similarly spaced from one another.

17. The detector of claim 11 wherein the strength of the generated signal from the read-out means corresponds to the length of the superconductive strip divided by the cross sectional area of the strip.

18. The detector of claim 11 wherein the read-out means comprises a superconductive thin film having opposite end directly coupled to the serpentine pattern at spaced locations; and a pair of Josephson junctions spaced from one another along the thin film intermediate the opposite ends.

19. The detector of claim 18 wherein the thin film of the read-out means is formed on the substrate exterior of the endless thin film strip of the detector.

20. The detector of claim 18 wherein the thin film of the read-out means is formed on the substrate within the endless thin film strip of the detector.

21. The detector of claim 18 wherein the spaced Josephson junctions are grain boundary type.

22. A method of optimizing kinetic inductance in a closed loop thin film superconductive endless strip quantum detector of a given size with a given Cooper pair mass, Cooper pair density, and Cooper pair charge, said method comprising
   minimizing the cross sectional area of said thin film superconductive endless strip; and
   maximizing the length of the closed loop of the thin film strip within the constraints of the given size.

23. The method of claim 22 wherein the step of maximizing the length of the thin film strip comprises forming a serpentine pattern of the endless strip to have a plurality of parallel spaced legs connected to adjacent legs at opposite ends positioned within a fixed outer perimeter.

24. A superconductive quantum detector, comprising a first substrate and a second substrate overlaying the first substrate;
   an endless thin film strip of superconductive material having a pair of spaced current biasing locations geometrically dividing the endless thin film strip into first and second lengths, the first length of the thin film strip being deposited on the second substrate in the form of a serpentine pattern and exposed to photon radiation, the second length of the thin film strip being sandwiched between the first and second substrate in a serpentine pattern substantially similar to the first length shielding the second length from radiant energy; and
   a SQUID coupled to the endless thin film strip for reading out a signal based upon kinetic inductance in the first and second lengths of the endless film strip.

25. The detector of claim 24 wherein the first and second lengths of the thin film strip are in the form of a pattern including a plurality of spaced parallel legs connected at opposite ends to adjacent parallel legs.

26. The detector of claim 25, wherein read-out means comprising an inductively coupled loop is insulatedly spaced from and in registry with the plurality of spaced parallel legs.

27. The detector of claim 26 wherein the read-out means comprises a superconductive strip having opposite ends connected to the first and second lengths; and a pair of spaced Josephson junctions formed in the strip between the opposite ends.

28. The detector of claim 27 wherein the spaced Josephson junctions are disposed adjacent one end of the spaced parallel legs.

29. A quantum detector comprising
   a substrate;
   a first endless thin film strip of superconductive material formed on said substrate, the first endless strip having an outer perimetrical boundary portion defined by at least two spaced legs and an additional length of the strip;
   a pair of spaced biasing current nodes on the first strip defining two portions of the first endless strip;
   a second thin film strip of superconductive material having opposite ends connected to the first thin film strip at spaced locations;
   a pair of spaced Josephson junctions formed in the second thin film strip between the connected opposite ends; and
   a read-out node on the second thin film strip between the spaced Josephson junctions.

30. The quantum detector of claim 29 wherein the second thin film strip of superconductive material is formed on the substrate outside of the perimetrical boundary of the first pattern.

31. The quantum detector of claim 30 wherein the spaced Josephson junction have a grain boundary.

32. The quantum detector of claim 29 wherein the second thin film strip of superconductive material is disposed within the perimetrical boundary of the detector.

33. The quantum detector of claim 29 wherein the substrate includes a first crystalline edge and a second opposing crystalline edge, the first crystalline edge being oriented offset from the opposing crystalline edge to form a grain boundary; a second thin film strip being epitaxially deposited above the grain boundary of the substrate to form a Josephson junction of the grain boundary type.

34. A quantum detector according to claim 29 wherein the first endless thin film strip of superconductive material is formed in a pattern of spaced parallel legs joining adjacent parallel legs at opposite ends of the legs, outer legs of the pattern being joined by a portion of the thin film strip substantially transverse to the longitudinal dimension of the legs, the transverse thin film strip having a slit extending parallel to the legs; the read-out means including a second thin film strip connected to the first thin film strip adjacent the opposite end of the second thin film strip, and a pair of Josephson junctions being spaced on opposite sides of the slit.

* * * * *